United States Patent [19]
Wood et al.

[11] Patent Number: 5,493,184
[45] Date of Patent: Feb. 20, 1996

[54] ELECTRODELESS LAMP WITH IMPROVED EFFICIENCY

[75] Inventors: Charles H. Wood, Rockville; Brian Turner, Myersville, both of Md.

[73] Assignee: Fusion Lighting, Inc., Rockville, Md.

[21] Appl. No.: 46,671

[22] Filed: Apr. 16, 1993

Related U.S. Application Data

[63] Continuation-in-part of Ser. No. 604,487, Oct. 25, 1990, abandoned.

[51] Int. Cl.⁶ .............................. H01J 11/04; H01J 65/04
[52] U.S. Cl. .......................... 315/344; 315/248; 315/267; 315/39
[58] Field of Search .............................. 315/39, 248, 344, 315/267; 313/485, 493

[56] References Cited

U.S. PATENT DOCUMENTS

| | | | |
|---|---|---|---|
| 3,725,716 | 4/1973 | Yamasaki | 313/185 |
| 3,748,520 | 7/1973 | Silver | 313/184 |
| 3,764,843 | 10/1973 | Van Eijl et al. | 313/184 |
| 4,206,387 | 6/1980 | Kramer et al. | 315/248 |
| 4,359,668 | 11/1982 | Ury | 315/248 X |
| 4,427,922 | 1/1984 | Proud et al. | 315/248 |
| 4,427,923 | 1/1984 | Proud et al. | 315/248 |
| 4,427,924 | 1/1984 | Proud et al. | 315/248 |
| 4,485,332 | 11/1984 | Ury et al. | 315/248 X |
| 4,501,993 | 2/1985 | Mueller et al. | 315/248 |
| 4,507,587 | 3/1985 | Wood et al. | 315/248 X |
| 4,636,692 | 1/1987 | LaPatovich et al. | 315/248 |
| 4,647,821 | 3/1987 | LaPatovich et al. | 315/248 |
| 4,783,615 | 11/1988 | Dakin | 315/248 |
| 4,887,192 | 12/1989 | Simpson et al. | 315/248 X |
| 4,902,935 | 2/1990 | Wood | 315/248 X |
| 4,954,756 | 9/1990 | Wood et al. | 315/39 |
| 4,975,625 | 12/1990 | Lynch et al. | 315/344 |

*Primary Examiner*—Benny T. Lee
*Assistant Examiner*—Haissa Philogene
*Attorney, Agent, or Firm*—Pollock, Vande Sande & Priddy

[57] ABSTRACT

An electrodeless lamp which operates with a high efficiency and with a lower cooling requirement. The bulb is rotated at a high speed which results in a substantial increase in efficiency. Because more of the input energy is converted to light, and less to heat, the pressure of the cooling fluid source may be reduced, resulting in a less noisy system.

22 Claims, 1 Drawing Sheet

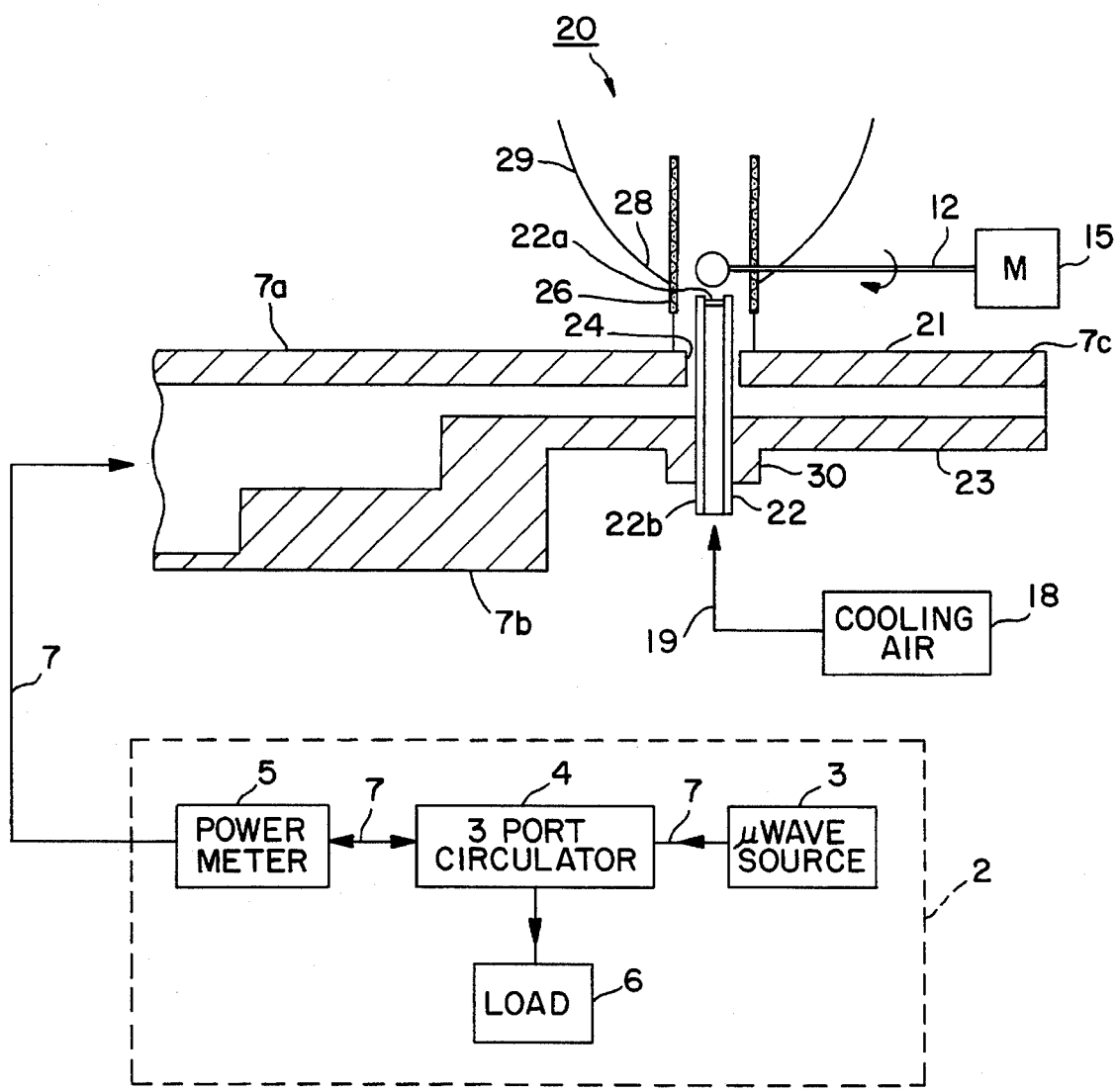

ELECTRODELESS LAMP WITH IMPROVED EFFICIENCY
ELECTRODELESS LAMP WITH IMPROVED EFFICIENCY

The present application is a continuation in part of application Ser. No. 604,487, filed Oct. 25, 1990, now abandoned.

BACKGROUND OF THE INVENTION

The present invention is directed to an improved electrodeless lamp and method, and particularly to an electrodeless lamp which operates at a high efficiency, and with lower cooling requirement.

The efficiency of a lamp is a measure of the light radiated as compared with the electrical energy which must be provided to the lamp to produce such radiated light. It is a very important measure of lamp performance because an increase in efficiency of only a few percent can lead to substantial savings in operating costs when a lamp is operated over time.

Additionally, electrodeless lamps become very hot during operation, and are typically cooled by directing pressurized air at the bulb. The use of pressurized air has the disadvantage of being noisy, and the cooling requirements of smaller bulbs are proportionately greater than those of larger bulbs. However, if the efficiency of the lamp can be improved, more of the inputted energy is converted to light, while less is converted to heat, and less pressurized cooling air is required, which accordingly generates less noise.

Conventionally, it has been thought that the efficiency (or efficacy) of a particular discharge lamp is dependent on the discharge fill composition and density, and on the power density which is applied to the fill.

In accordance with the present invention, it has been discovered that rotating the bulb at high speed results in increased efficiency. Furthermore, the increase in efficiency which is achieved is substantial. A "substantial" increase in efficiency as defined herein means an increase in efficiency of at least about 5% or greater, wherein "efficiency" is defined as the visible light power radiated by the lamp divided by the microwave or r.f. input power. In accordance with the preferred embodiment of the invention which is disclosed herein, the increase in efficiency which is achieved is about 15%.

Additionally, in accordance with the present invention, the lamp may operate with a substantial reduction in cooling requirement. This allows a less noisy source of pressurized cooling fluid to be used, which is an important advantage. As used herein, a "substantially lower" cooling fluid pressure refers to a cooling fluid pressure which is at least about 20% lower than that which would be necessary in the absence of the increase in efficiency which is provided by the high speed rotation.

By way of reference to the prior art, U.S. Pat. No. 4,485,332 teaches the idea of rotating an electrodeless lamp envelope while impinging at least one stream of pressurized air on it for the purpose of more effectively cooling the lamp. Before the invention in U.S. Pat. No. 4,485,332, pressurized cooling air was impinged on a stationary bulb, with the result that cooling was not as effective, and the lamp had to be operated at lower power densities to prevent overheating.

U.S. Pat. No. 4,954,756 discloses the idea of rotating an electrodeless lamp envelope at high speeds (1500–2500 RPM for envelopes of 0.75 inch to 1.5 inch diameter) to obtain bulb surface temperature equalization and change in the spatial emission properties of the lamp. The patent further teaches that there is an inverse relationship between the required rotation speed and bulb diameter. There is no disclosure that an increase in lamp efficiency is obtained in U.S. Pat. No. 4,954,756.

U.S. patent application Ser. No. 953,056, filed Sep. 30, 1992, discloses the operation of a microwave lamp having a small bulb (internal diameter of about ¼" or 6.35 mm) in a microwave cavity, while U.S. patent application Ser. No. 976,938, filed Nov. 18, 1992 discloses the operation of a similar bulb which is powered by a coaxial exciter. It is disclosed that when these bulbs are rotated at medium speeds (when bulb diameter is taken into account) of 2000–3000 RPM, isolated discharges and arc attachment effects do not occur. While the avoidance of these effects is important to the success of lamp operation, increased lamp efficiency is not obtained.

In accordance with the broader aspects of the present invention, improved lamp efficiency and a lower cooling requirement are achieved by rotating an electrodeless lamp bulb which contains a light emitting fill at high speed.

SUMMARY OF THE INVENTION

In accordance with the preferred aspects of the invention, the light emitting fill substance is such to produce molecular radiation, including for example, such substances, which when energized, contain polymeric species. The beneficial effects of the invention may be realized to a greater extent when the lamp is excited in a mode where the applied electric field in the fill volume is relatively non-uniform.

Particular examples of suitable light emitting fill substances are sulfur and selenium, and compounds thereof. Such substances, either by themselves or with additives, have been found to generate light with high efficacy and to provide good color rendition, and lamps which are based on such fill substances are disclosed in U.S. patent application Ser. No. 604,487, filed Oct. 25, 1990, which is incorporated herein by reference. Also, in a lamp which is excited by a coaxial exciter, the electric field throughout the fill volume is not uniform. Small bulbs, for example, those of less than ½ inch diameter are desirable for many applications because of the optical requirements of particular systems, and are encompassed by the present invention.

In a preferred embodiment of the invention, it is possible to operate a very small bulb of about 5 mm internal diameter which has a sulfur containing fill and is excited in a coaxial mode, at substantially increased efficiency by rotating the bulb at a high speed of greater than about 8000 RPM.

BRIEF DESCRIPTION OF THE DRAWINGS

The invention will be better understood by referring to the accompanying drawings wherein:

The Figure shows an embodiment of the invention.

DESCRIPTION OF THE PREFERRED EMBODIMENT(S)

Referring to the figure, a preferred embodiment of the invention will be described. The lamp fixture generally designated by 20 is fed power from an experimental set up power system generally designated by reference numeral 2.

The power system is configured as follows. A microwave or radio frequency (r.f.) source 3 generates power. The power density applied to the bulb is preferably from about a few hundred to about 10,000 watts per cubic centimeter of bulb volume.

The source 3 is coupled to a three port circulator 4 which isolates the source 3 from non-absorbed power that is reflected from the fixture 20. The circulator is connected to a power meter 5 which measures forward and reflected power and a dissipative load 6 which absorbs reflected power. Power flows through the power meter 5 to the section of waveguide 7a which is connected to fixture 1. All connection lines designated by reference numerals 7, 7a represent rectangular waveguide. The dissipative load 6 is connected directly to the circulator 4. In a finalized production design, the power system 2 may be considerably simplified by eliminating the power meter 5, circulator 4, and dissipative load 6, once the design is fixed and finally tuned.

The waveguide section 7a is connected to a stepped section 7b which comprises two steps in the height of the waveguide connected to low height section of waveguide 7c. The steps serve as an impedance transformer to partially match the impedance of the waveguide 7, 7a to that of the fixture 20 which is mounted on the top broadside 21 of the low height waveguide section 7c. The inner conductor 22 is mounted on the lower broad wall 23 of the reduced height waveguide section 7c, and extends upwards through a hole 24 in the upper broad wall 21. The inner conductor is fixed by set screw 30. The hole in the upper broad wall 21 is large enough to provide insulating gap clearance. The top 22a of the inner conductor 22 is located below the end of the bulb. In the embodiment shown, the top of the inner conductor 22 is recessed. Cooling air is fed from source 18 through line 19 to the bottom of the inner conductor 22 at the lower broad wall 23, through a bore 22b up the length of the inner conductor 22b to one or more cooling air jet orifices in the base of recess 22a and is jetted against the bulb 12. Preferably the cooling holes (not shown) comprise two holes of 0.9 mm arranged along the equator of the bulb and two holes of 0.5 mm arranged near the respective poles of the bulb. (The bulb stem 12 abuts the bulb at one pole). All the holes are arranged on a circle 3.0 mm diameter centered below the bulb. The outer conductor comprises an open cylindrical wall 26 connected to the upper broad wall 21. It is taller than the inner conductor. Although in the experimental model even with top of the outer conductor 26 open there is little leakage, the top may be capped with a suitably shaped end piece such as a flat piece or a spherical piece. The cylindrical wall 26, which may be at least partially foraminous or mesh-like, can serve as the outer conductor while at the same time being substantially transparent to the radiation of the lamp. Located around the bulb outside the outer conductor 26 is a metal reflector 29. The inner conductor 22 and the outer conductor 26 form a coaxial excitation structure, which produces high strength electromagnetic fields necessary for coupling to small, high power electrodeless discharge lamps.

The stem of the bulb 12 extends through a hole in the mesh 26 and a hole in the reflector 29 to a motor 15 to which it is mechanically coupled, which serves to rotate the bulb about an axis through the stem during operation.

In the coaxial excitation structure formed by inner conductor 22 and the outer conductor 26, high electromagnetic fields are produced in the region between the bulb 12 and the inner conductor 22. These fields might tend to create arcs between the bulb and the inner conductor were it not for the cooling air emanating from the holes in the top 22a of the inner conductor. It is noted that although the outer conductor 26 is shown as being a cylinder of diameter not much bigger that the inner conductor, it is contemplated that the outer conductor may be much larger and may serve a dual purpose such as the reflector or a housing.

In accordance with the present invention, the bulb is rotated at a high speed, which is sufficient to result in an increase in efficiency of lamp 20.

Fill substances which are advantageously utilized are those which emit molecular radiation, including such substances which when excited include polymeric species. Such substances include sulfur and selenium and compounds thereof, as well as similar molecular emitters. It is noted, that in the case of sulfur, in addition to $S_2$, polymeric species such as $S_4$ and $S_6$ are also formed in the excited discharge.

Any light emitting sulfur or selenium containing fill may be used, for example those including elemental sulfur or selenium or compounds such as $InS$, $As_2S_3$, $S_2Cl_2$, $Cs_2$, $In_2S_3$, $SeS$, $SeO_2$, $SeCl_4$, $SeTe$, $CSe_2$, $P_2Se$, and $SeAs$, as well as other light emitting compounds of sulfur and selenium, for example, those having a low vapor pressure at room temperature, and a high vapor pressure at the operating temperature of the lamp.

The amount of fill is such to result in pressure of greater than 1 atmosphere and preferably 2 to 20 atmospheres during operation. Additionally, if the lamp is powered by microwave power, such power which is coupled to the bulb is greater than 50 watts/cc. Instead, r.f. power may be used to excite the fill. Such a lamp, at least in certain implementations relies on molecular radiation as the dominant source, and is able to provide radiation principally within the visible range.

As mentioned above, there is an inverse relationship between bulb diameter and the rotation speed. For a sulfur containing fill, having a microwave power coupled to the bulb of at least 150 watts, wherein the angular rotation frequency is w, and the maximum bulb radius as measured from the axis of rotation is r, it has been determined that an increase in efficiency in accordance with the present invention is obtained when $w^2r$ is at least $1.75 \times 10^5$ cm/sec$^2$.

EXPERIMENT 1

A test model in which the invention was operated as will be described below had the following features: the bulb was spherical in shape with a 5 mm inside diameter and a ½ mm wall thickness. The bulb was made of quartz, and contained a discharge fill of 0.3 mg of sulfur and 150 torr of argon. Four cooling orifices of 0.030" diameter were equally spaced on a circle of 3.0 mm, on the end 22a of the inner conductor. The inner conductor was 4.75 mm in diameter and its end was spaced 2.0 mm away from the bulb in the axial direction. The microwave frequency was 2.45 GHz. The power coupled to the bulb was 220 watts.

For test purposes a light meter was arranged in front of reflector in the center of beam thrown by it in order to measure the light output from the bulb. With the reflector present, the reading taken is not indicative of the absolute brightness because the radiation is not isotropic from the bulb, however because the reflector collects radiation from all parts of the bulb it is indicative of the relative brightness averaged over the whole bulb as experimental parameters are changed. The bulb was rotated at 3800 RPM. This speed was sufficient to create a discharge which filled the entire bulb according to the teachings in pending application Ser. No. 953,056 filed Sep. 30, 1992, and sufficient to avoid arc attachment as taught in application Ser. No. 976,938 filed Nov. 18, 1992.

Cooling air pressure of 10 PSI was required to maintain the bulb temperature below the maximum temperature specification of 1000° C., which is dictated by bulb life requirements. This amount of cooling air produced an audible noise of 83 decibels, as measured using an A Weighted response, which approximates the response of the human ear. In using different speed motors available to the inventors with speeds between 2000 RPM and 3800 RPM, no change in efficiency was detected.

EXPERIMENT 2

The same test model as used in experiment 1 was used. The rotation speed was raised to 12,000 RPM. With 10 PSI of cooling air pressure, the light output was increased 6%, and the bulb temperature dropped by about 100° C. Upon reducing the cooling air to 5 PSI the bulb temperature returned to 1000° C., and the relative output increased further, bringing the total increase in relative output to 15%. The noise from the cooling jet was reduced to 71 decibels (measured as described above) by the reduction in pressure. Thus two important advantages are realized, the first being the increase in light output, and the second being the reduction in lamp noise. In sum, it is observed that the high speed rotation alters the energy conversion efficiency characteristics of the plasma, such that more of the input energy is converted to light and less is dissipated as heat.

For small bulbs as described above, including a sulfur containing fill, threshold rotation speeds as low as 8000 RPM have shown improvements in efficiency. Since the invention can be employed with bulbs of different sizes, when speed is normalized for maximum bulb radius r, and the threshold angular frequency is w, to realize an increase in efficiency in accordance with the invention, $w^2r$ is at least $1.75 \times 10^5$ cm/sec$^2$.

After reaching threshold speed, it has been found that the efficiency increases monotonically with speed until a plateau region is reached, where there are no increases or decreases in efficiency. For the lamp specifically described above, the plateau region began at about 13,000 RPM. The threshold speed and plateau speed have been found to be dependent on the power which is coupled into the bulb, with higher powers generally requiring higher speeds.

The light source described above is a bright source which is operated at relatively high efficiency. It may be particularly useful when employed in projection systems. While the invention has been described in connection with a bulb which is spherical in shape, this need not be the case, although bulbs wherein the ratio of maximum to minimum internal dimension is less than about 5 will be advantageous for particular applications, e.g. as a liquid crystal projection source.

Although according to the preferred embodiment as detailed above, the coaxial fixture 20 is a means of applying electromagnetic energy to the bulb, other means such as a microwave cavity, an inductive coupling coil, or capacitive coupling electrodes may be employed in the practice of the invention.

It should be appreciated that while the invention has been disclosed in connection with illustrative embodiments, variations will occur to those skilled in the art, and the scope of the invention is to be limited only by the claims appended hereto as well as equivalents.

We claim:

1. An electrodeless lamp comprising, an electrodeless lamp bulb enclosing a discharge forming fill, said lamp bulb having a maximum internal dimension of less than 7 millimeters, means for coupling electromagnetic energy to said fill to excite said discharge forming fill to form a discharge which radiates light, and means for rotating said bulb about an axis at a speed which is sufficiently high to result in a substantial increase in the efficiency at which said light is radiated from the bulb.

2. The electrodeless lamp of claim 1 wherein said substantial increase in efficiency is at least about 5%.

3. The electrodeless lamp of claim 1 wherein said substantial increase in efficiency is at least about 10%.

4. The electrodeless lamp of claim 1 wherein the light which is radiated by the discharge is molecular radiation.

5. The electrodeless lamp of claim 1 wherein said light is visible light, which is emitted by sulfur or a sulfur compound, which is present in said fill when excited.

6. The electrodeless lamp of claim 1 wherein said electromagnetic energy is microwave or r.f. energy.

7. An electrodeless lamp comprising, an electrodeless lamp bulb enclosing a discharge forming fill, which includes sulfur or a sulfur compound, said lamp bulb having a maximum internal dimension of less than 7 millimeters, means for coupling electromagnetic energy to said fill to excite said discharge forming fill to form a discharge which radiates light, and means for rotating said bulb about an axis at a speed which is sufficiently high to result in a substantial increase in the efficiency at which said light is radiated from the bulb.

8. The electrodeless lamp of claim 7 wherein said sulfur or sulfur compound results in the emission of visible light by the excited fill.

9. The electrodeless lamp of claim 8 wherein the bulb is rotated at a speed of greater than about 8000 RPM.

10. The electrodeless lamp of claim 7 wherein said electromagnetic energy is microwave or r.f. energy.

11. The electrodeless lamp of claim 10 wherein said discharge forming fill emits radiation principally within the visible range.

12. An electrodeless lamp comprising, an electrodeless lamp bulb enclosing a sulfur containing discharge forming fill, means for coupling electromagnetic energy to said discharge forming fill to excite said fill to form a discharge which radiates light, said bulb having a maximum radius r, which is measured radially with respect to a rotation axis, and means for rotating said bulb about said rotation axis at an angular frequency w, wherein $w_2r$ is at least about $1.75 \times 10^5$ cm/sec$^2$.

13. The electrodeless lamp of claim 12 wherein r is less than about 7 millimeters.

14. The electrodeless lamp of claim 13 wherein said means for coupling electromagnetic energy comprises coaxial exciter means.

15. The electrodeless lamp of claim 12 wherein light which is radiated by said lamp is visible light, which is emitted by sulfur in the fill.

16. The electrodeless lamp of claim 12 wherein said electromagnetic energy is microwave or r.f. energy.

17. The electrodeless lamp of claim 16 wherein said sulfur containing fill emits radiation principally within the visible range.

18. An electrodeless lamp comprising, an electrodeless lamp bulb enclosing a discharge forming fill, which includes selenium or a selenium compound, said lamp bulb having a maximum internal dimension of less than 7 millimeters, means for coupling electromagnetic energy to said fill to excite said discharge forming fill to form a discharge which radiates light, and means for rotating said bulb about an axis at a speed which is sufficiently high to result in a substantial increase in the efficiency at which said light is radiated from the bulb.

19. The electrodeless lamp of claim 18 wherein said selenium or selenium compound results in the emission of visible light by the excited fill.

20. The electrodeless lamp of claim 18 wherein said electromagnetic energy is microwave or r.f. energy.

21. The electrodeless lamp of claim 20 wherein said discharge forming fill emits radiation principally within the visible range.

22. An electrodeless lamp having improved efficiency comprising, an electrodeless lamp bulb having a maximum internal dimension of less than 7 millimeters which encloses a discharge forming fill which is capable of radiating molecular radiation upon excitation, means for coupling electromagnetic energy to said fill to excite said discharge forming fill to form a discharge which emits molecular radiation, and means for rotating said bulb about an axis at a speed which is sufficiently high to result in a substantial increase in the efficiency at which said radiation is emitted from the bulb.

\* \* \* \* \*